United States Patent [19]
Timmer

[11] Patent Number: 5,928,727
[45] Date of Patent: *Jul. 27, 1999

[54] METHOD FOR ELECTROPLATING ELASTOMER-MODIFIED POLYPHTHALAMIDE ARTICLES

[75] Inventor: Roger James Timmer, Lowell, Mich.

[73] Assignee: Lacks Industries, Inc., Grand Rapids, Mich.

[ * ] Notice: This patent is subject to a terminal disclaimer.

[21] Appl. No.: 08/907,725

[22] Filed: Aug. 8, 1997

Related U.S. Application Data

[63] Continuation-in-part of application No. 08/863,497, Jun. 2, 1997.

[51] Int. Cl.$^6$ ........................................................ B05D 5/12
[52] U.S. Cl. .................... 427/307; 427/301; 427/306; 427/437; 427/443.1; 427/356; 205/167; 205/168; 205/187; 205/210
[58] Field of Search ..................................... 427/301, 306, 427/307, 353, 405, 437, 443.1; 205/164, 167, 168, 169, 187, 210

[56] References Cited

U.S. PATENT DOCUMENTS

| | | |
|---|---|---|
| 3,574,070 | 4/1971 | Sahely . |
| 4,125,649 | 11/1978 | Donovan et al. .................... 427/307 |
| 4,610,895 | 9/1986 | Tubergen et al. . |
| 4,770,751 | 9/1988 | Kawagishi et al. . |
| 5,015,329 | 5/1991 | Patel et al. . |
| 5,098,940 | 3/1992 | Brooks . |
| 5,153,250 | 10/1992 | Sinclair . |
| 5,160,600 | 11/1992 | Patel et al. . |
| 5,198,096 | 3/1993 | Foust et al. . |
| 5,213,841 | 5/1993 | Gulla et al. . |
| 5,283,284 | 2/1994 | Brooks et al. . |
| 5,288,793 | 2/1994 | Chen . |
| 5,292,805 | 3/1994 | Paschke . |
| 5,415,762 | 5/1995 | Allardyce et al. . |
| 5,436,294 | 7/1995 | Desio et al. . |
| 5,457,152 | 10/1995 | Gaa et al. . |
| 5,565,574 | 10/1996 | Carlberg . |

*Primary Examiner*—Brian K. Talbot
*Attorney, Agent, or Firm*—Vanophem Meehan & Vanophem, P.C.

[57] ABSTRACT

A process for metal plating a high impact, high temperature plastic suitable for forming trim elements of an automobile. The process is particularly directed to plating an elastomer-modified PPA resin, and entails closely controlled process steps that include selectively etching the elastomer and the PPA matrix with a solution containing chromic acid, then effectively removing from the substrate any retained chromium which would adversely affect the ability of metal plating to adhere to the substrate, and thereafter protecting the substrate from attack by sulfuric acid. The process is particularly effective for electroplating a PPA resin modified with about five to about 30 weight percent elastomeric materials.

31 Claims, No Drawings

1

METHOD FOR ELECTROPLATING ELASTOMER-MODIFIED POLYPHTHALAMIDE ARTICLES

CROSS REFERENCE TO RELATED APPLICATION

The present application is a continuation-in-part application of copending U.S. Ser. No. 08/863,497 filed Jun. 2, 1997 still pending.

BACKGROUND OF THE INVENTION

1. Field of the Invention

The present invention generally relates to methods for electroplating a metal onto a plastic substrate. More particularly, this invention relates to a method for electroplating polyphthalamide compositions in which an impact-enhancing elastomeric material is dispersed.

2. Description of the Prior Art

Motor vehicles often include a substantial number of chrome-plated trim elements for both decorative and functional purposes. Such trim elements include bumpers, body side moldings, lower body claddings, wheel covers and grilles as well as other components. The overall appearance of the vehicle is significantly enhanced by these highly reflective chrome surfaces. However, trim elements also serve a functional purpose in that they help to absorb impact when the vehicle is involved in a collision and when the vehicle contacts flying gravel, road debris, roadway abutments or the like. Accordingly, plated metal on a trim element preferably must withstand impact without chipping, cracking, or delaminating.

Traditionally automotive trim elements have been manufactured from materials such as chrome-plated steel, anodized aluminum and stainless steel, which are capable of absorbing relatively high impacts. However, such traditional trim elements not only add significantly to the cost of the vehicle, but also substantially increase the vehicle weight thereby decreasing fuel economy. Therefore, there has been considerable effort by the automotive industry toward developing a cost effective, lightweight alternative to the traditional trim materials, and particularly chrome-plated metals. Plateable plastics are such a desirable alternative, because they not only reduce the vehicle weight, and thereby correspondingly increase the vehicle fuel economy, but plateable plastics also allow for part consolidation within the automobile. Plastics have much greater design flexibility than metals, in that they can be easily molded into a variety of complex and contoured configurations that cannot be achieved with conventional metal stamping and forming operations. In addition, when components are formed from plastic materials, a significant cost savings can be realized over comparable components formed from metal.

A wide variety of plated plastics are known. For example, acrylonitrile-butadiene-styrene (ABS) has been plated to provide decorative articles such as headlamp surrounds, and plumbing and marine hardware, and polycarbonates (PC) have been utilized as the substrate for plated motor vehicle door handles. In addition, several other plastics have been successfully plated for various decorative purposes. However, these plastics, though plateable for decorative purposes, do not generally provide a satisfactory substrate if the finished article must be capable of sustaining significant impact or endure hot/cold thermal cycling. Accordingly, the use of plated ABS and PC plastics on an automobile has been limited because the plated metal is prone to delamination if the plastic is subjected to low energy impact. In addition, as an extreme example, these plastic materials may even shatter upon impact.

Thus, for a plastic to be suitable as a substrate for a plated component of an automobile, it must generally have sufficient impact and thermal cycle resistance. Furthermore, its impact resistance must be acceptable over a wide range of temperatures. Attempts to develop impact-resistant plastics have resulted in the formulation of many blends, including acrylonitrile-butadiene-styrene (ABS)-modified polycarbonate resins as taught in U.S. Pat. No. 5,846,665 to Timmer et al. (assigned to the assignee of the present invention), and polyphthalamide (PPA) resins commercially available under the trademark AMODEL from Amoco Performance Products, Inc. PPA resins are characterized by high strength at elevated temperatures. PPA resins can be processed to contain various reinforcement fibers and fillers to promote their mechanical and physical properties. In particular, PPA resins modified with up to 15 weight percent dispersed elastomer have been found to exhibit excellent impact resistance.

The present literature indicates that articles formed of mineral-filled PPA resins can be metallized by electroless and electroplating techniques. In particular, if the PPA resin has been specifically formulated for electroless plating, conventional electroless techniques developed for ABS resins can be used to develop a thin layer of metal. Such techniques have generally entailed etching with a chromic acid-sulfuric acid etch solution, then treating the etched surface with a neutralizing solution, a catalyzing solution of a noble metal salt solution, an acid accelerating solution, and then an electroless plating solution. The electroless metal layer, typically copper, can serve as a functional plating, e.g., EMI/RFI shielding, or as the cathode for a subsequent electroplating process to yield a decorative finish on the article.

However, attempts to plate certain modified PPA compositions have been plagued with poor metal adhesion and/or blistering. More particularly, unfilled impact-modified PPA resins have been determined to be very difficult to successfully plate, defined herein as the resulting metal plating having a peel strength of greater than about two pounds (about 8.9 Newtons). Employing conventional ABS processing, metal plating exhibits unreliable plate deposition and adhesion. Consequently, skip (areas without coverage) and blistering result in an unacceptable product. At best, the metal plate blisters with thermal cycle testing. While various methods have been suggested for improving adhesion between plated metal and a plastic substrate, such as pre-etch conditioning as taught in U.S. Pat. No. 4,125,649 to Donovan et al., such techniques have not solved the problem of poor adhesion of plated metal to an article formed of an elastomer-modified PPA resin.

Accordingly, what is needed is a process for electroplating metal to an impact-resistant, high temperature PPA plastic, particularly an elastomer-modified PPA substrate, wherein the resulting product is characterized by excellent adhesion between the metal plating and the PPA substrate.

SUMMARY OF THE INVENTION

According to the present invention, there is provided a process for metal plating a high impact, high temperature plastic suitable for forming trim elements of an automobile. The process is particularly directed to plating an elastomer-modified PPA resin, and entails closely controlled process steps that include selectively etching the elastomer and the PPA matrix with a solution containing chromic acid, then effectively removing from the substrate any retained chromium that would adversely affect the ability of metal plating to adhere to the substrate, and thereafter minimizing certain reactions that have been unexpectedly determined to adversely affect the ability of metal plating to adhere to the PPA matrix. The process is particularly adapted for electroplating a PPA resin modified with about five (5) to about thirty (30) weight percent EPDM (ethylene-propylene diene monomer) rubber, EPR (ethylene propylene rubber) and/or SBR (styrene-butadiene rubber).

The process of this invention generally begins with etching a surface of an article formed of the elastomer-modified PPA resin. The etching solution contains trivalent chromium ions, hexavalent chromium ions and sulfuric acid, with a sufficient level of trivalent chromium being maintained in the etching solution to buffer the surface of the article, i.e., provide a level of protection to the surface from the other constituents of the etch solution. In a preferred embodiment, trivalent chromium is maintained at about a minimum of 6.5 to preferably about 7.5 ounces per gallon (about 49 to about 56 grams/liter) of solution. According to the invention, control of the minimum parameter of the trivalent chromium has been unexpectedly found to be critical, with lower levels resulting in poor adhesion of the final metal plating, while higher levels can potentially be a cause for the formation of small blisters in the metal plating depending upon other parameters in the subsequent steps, i.e. the aggressiveness of the accelerator. If the accelerator is contaminant free (less aggressive) higher levels of trivalent chromium can result in an acceptable surface. The etching solution is maintained at a temperature and contacts the surface of the article for a duration sufficient to etch the PPA matrix and the elastomeric material so as to produce micropores in the surface, yielding a roughened surface with anchoring points that render the surface suitable for plating.

In order to control the amount of chromium that is absorbed into the substrate material it is preferred that after etching the surface is rinsed with a solution maintained at a temperature below about 100 F. This step is unconventional, in that rinse solutions are generally well above 100 F. as a result of the proximity of the rinse solution to the etch bath and the transfer of heat from etched articles to the rinse bath. Unexpectedly, by maintaining the temperature of the rinse solution preferably to below about 100 F., reliable adhesion of a metal plating to the elastomer-modified PPA material is made possible. In contrast, rinse temperatures well above about 100 F. result in skip or non-coverage of the metal plating as well as low plate adhesion. With reference to Table II, it is recognized that rinse solution temperatures of up to 130° F. will result in an aesthetically acceptable plated surface. Adhesion, i.e. peel strength, will, however, be significantly reduced and such plated surface will not withstand the impact and thermal cycle resistance tests which are required to be passed for in service use. The significance of this feature of the invention is to control the extent to which chromium is absorbed and retained in the substrate surface. While chromium absorption occurs during etching, it was unexpectedly found that chromium absorption occurs more readily in dilute etch solutions, such as the rinse solution, than in the more concentrated etch solution.

Following the rinse after etch, the surface of the article is neutralized to remove the remnant chromium from the etching step. While neutralizing solutions based on hydrochloric acid or sulfuric acid can be used, it is believed that plating adhesion is improved if hydrochloric acid is used due to enhanced removal of chromium by this acid. The surface of the article is then catalyzed using a suitable noble metal salt solution, and then treated with an accelerator solution.

Following treatment with the accelerating solution, a metal layer is electrolessly deposited on the surface. The resulting electroless metal plating can serve as a functional plating, e.g., EMI/RFI shielding, or serve as the cathode for a subsequent electroplating process to yield a decorative metal finish on the article. It is believed that, because PPA resins are sensitive to aggressive acids, the thickness of the electroless metal plating must be at least 0.000020 inch (about 0.5 micrometer) in order to protect the PPA matrix from sulfuric acid present in any subsequent electroplating bath, as is the case with a preferred first electroplating bath used by this invention.

According to this invention, the above processing steps make possible the electroplating of an elastomer-modified PPA resin, wherein the peel strength of the electroplated metal can exceed eight pounds (about 36 Newtons). If the steps indicated above are not closely followed, the result is an unreliable metal plating that exhibits unacceptable plate adhesion, or at best is plagued by skip and unacceptable levels of blistering or a propensity for delamination. While not wanting to be limited to any particular theory, it is believed that elastomer-modified PPA resins are particularly susceptible to chromium uptake and attack by strong acids, and that maintaining the disclosed levels of trivalent chromium ions in the etching solution, maintaining targeted parameters in the rinse solution, followed by protection of the substrate and electroless metal from subsequent exposures to sulfuric acid, are all necessary to achieve acceptable adhesion of electroless and electroplated metal to an elastomer-modified PPA substrate. Abrupt changes in adhesion are particularly noted within processing ranges conventionally employed to metal plate other plastic materials, such as ABS or PC/ABS blends. With the process of this invention, electroplated impact-resistant PPA articles are formed characterized by having exceptional adhesion between the electroplated metal and the PPA substrate. Even upon impact and thermal cycling, the metal plating adheres well to the PPA substrate without chipping, cracking or delamination.

Accordingly, it is an object of this invention to provide a process for electroplating metal on an elastomer-modified PPA substrate.

It is another object of this invention that such a process yields an elastomer-modified PPA substrate characterized by good adhesion between the metal plating and the PPA substrate so as to withstand an impact without delamination of the metal plate from the substrate to enable surpassing published automotive thermal cycling specifications.

It is a further object of this invention that such a process entails maintaining critical minimum levels of trivalent chromium ions in the etching solution, targeted process parameters in the post-etch rinse solution, and limited and/or controlled exposure to sulfuric acid in subsequent processing steps so as to enable adhesion of metal plating to the PPA substrate.

Other objects and advantages of this invention will be more apparent after a reading of the following detailed description.

DETAILED DESCRIPTION OF THE PREFERRED EMBODIMENT

This invention provides a process for forming a metal plated, and particularly an electroplated, elastomer-modified polyphthalamide (PPA) resin article suitable for use in applications that require good impact and thermal cycle resistance, such as automotive trim elements. The adhesion between the elastomer-modified PPA resin and the electroplated metal is exceptional, such that upon impact the metal adheres well without chipping, cracking or delamination from the substrate and in addition surpasses published automotive thermal cycle/corrosion test specifications. While this invention is particularly applicable to chrome plating trim elements for automotive applications, those skilled in the art will appreciate that the teachings of this invention are applicable to other plating metals and applications.

In general, the process of this invention entails etching a surface of an elastomer-modified PPA article with an acidic solution, followed by a neutralizing solution, followed by treating the surface with a catalyst and accelerant, electrolessly plating a layer of metal, and then finally electrochemically depositing a desired metal plate onto the electroless metal. Solvent pretreatment or conditioning of the surface is generally unnecessary. Preferred elastomer-modified PPA resins are available from Amoco Performance Products, Inc. While PPA resins modified with up to 15 weight percent elastomer are known, a preferred material for this invention contains about 25 weight percent dispersed elastomer, though it is foreseeable that the elastomer content could vary between about 5 to about 35 weight percent. An elastomer weight content of about 25 percent is preferred as a result of exhibiting exceptional metal plate adhesion, while metal plated on PPA resin substrates modified with 15 weight percent elastomer were determined to be prone to blistering and/or exhibit low adhesion. Furthermore, 25 weight percent elastomer-modified PPA exhibits exceptional impact resistance, e.g., an instrumented dart energy of about 420 inch-pounds (about 47 N.m) at −30° F. (about −34° C.), and a ductile failure mode.

According to this invention, the surface of an elastomer-modified PPA substrate is first cleaned to remove oils and surface contaminants. The surface is then etched by exposure to a chromic acid-sulfuric acid etching bath maintained at approximately 140° F. to 165° F. (about 60° C. to about 75° C.) for a duration of about three to fifteen minutes. The etching bath contains a critical amount of trivalent chromium ions in addition to hexavalent chromium ions provided by the chromic acid. The optimal level range for trivalent chromium is above 6.5 ounces per gallon (about 49 grams/liter) of a solution containing about 3.5 to about 4.5 pounds chromic acid per gallon (about 420 to about 540 grams/liter) of solution, and about ten (10) to thirty (30) volume percent sulfuric acid, although levels above this minimum up to 7.5 ounces per gallon (about 56 grams/liter) of solution are preferred. Levels of trivalent chromium below this range can result in electroplated metal that exhibits poor adhesion of the final metal plating, while higher levels can potentially be a cause for the formation of small circular blisters in the metal plating. While not wanting to be limited to any particular theory, it is believed that such formations are regions of the PPA substrate rich in highly crystalline polyphthalamide and low in elastomer. The etching bath may be formed by adding 3.5 to 4.5 lbs./gallon chromic acid, then adding concentrated sulfuric acid to provide a solution having a normality of about 9 to about 12. The result is an etch solution containing about ten (10) to thirty (30) volume percent sulfuric acid. The above-noted controlled amount of trivalent chromium is generated as the bath oxidizes sufficient material to convert the hexavalent chromium (provided by the chromic acid) to trivalent chromium. As the concentration of the acid bath is varied, the temperature of the bath and duration of the exposure may be appropriately modified within the temperature range and time period noted above.

According to this invention, the hexavalent chromium ions within the etch bath attack the PPA backbone somewhat and aggressively attack the elastomer at the surface of the substrate, while the sulfuric acid in the bath contributes to the attack. With the relative levels of hexavalent and trivalent chromium ions and sulfuric acid provided in accordance with the above, the surface of the substrate is roughened in such a way as to promote adhesion of a subsequent metal plating by more selectively etching away the elastomer to provide anchoring points in the surface. An adequate level of trivalent chromium has been determined to be necessary to buffer the etching rate of the PPA matrix so that the elastomer phase suppling the anchoring points is selectively etched. If too little trivalent chromium ions are present, lower adhesion results due to less selective, excessive etching. This condition produces insufficient anchoring points to the extent that metal plating will not adhere to the substrate. In contrast, excessive levels of trivalent chromium ions above the range lead to inadequate etching of the highly crystalline portion of the PPA base resin, the principal manifestation generally being the formation of blisters in the metal plating. Consequently, there is an optimal range for trivalent chromium ions that must be maintained in order to yield an acceptable metal plating that will adhere to an elastomer-modified PPA substrate.

An alternate method to obtain a properly etched surface for this invention is to minimize agitation of the etch bath. While conventional practice is to provide air agitation to continuously flush the substrate surface, doing so has been unexpectedly found to reduce metal plate adhesion on an elastomer-modified PPA substrate. While some agitation is necessary to maintain a homogeneous etch bath, the process of this invention preferably avoids directly impinging the substrate surface during etching. The purpose of minimizing agitation of the etching bath is that, as agitation is minimized, trivalent chrome will build up on the surface after some etching occurs. This localized build-up of trivalent chrome slows down the etching action, so if agitation of the etch bath is minimized the localized build up of trivalent chrome will not be washed off and one will obtain the same effect as if a high trivalent chrome bath was being used. Therefore, no agitation of the etch bath provides similar results as if a high trivalent chrome bath was used. Alternately, a high trivalent chrome bath can be used with appropriate agitation.

Once etched, the substrate is rinsed using a water solution whose composition and temperature are carefully controlled to reduce the absorption of chromium that inherently accumulates in the rinse as substrates are rinsed. According to this invention, preferably without concentration control, the temperature of the rinse solution of the preferred embodiment must be maintained preferably below about 100° F. (about 38° C.). However, with concentration control, it is foreseeable that temperatures as high as 130° F. can be used to produce a visually acceptable surface although such surface is unlikely to withstand the thermal cycle and impact resistance tests that are required for in-service use. Because prior art rinse solutions are generally at elevated temperatures (110° F. to 130° F. and as high as 140° F. without concentration control) due to heat transfer from the etched articles as well as the proximity of the rinse tank to the etch tank, a suitable post-etch rinse tank employed by this invention must be equipped with a cooling system, whose construction and operation would be understood by those skilled in the art. In addition to rinse temperature, the time during which the substrate is subjected to the rinse cannot be excessive (above or about 10–12 minutes) if acceptable adhesion levels are expected. If the rinse temperature or duration exceeds the above parameters, metal plating subsequently deposited on the surface of the PPA substrate will not adhere sufficiently. Moreover, any retained moisture following the rinse is also detrimental to the integrity of the metal plating, such that drying or immediate commencement of the next processing step is desirable.

Following the rinse step, the surface of the PPA article is subjected to a neutralizing solution. As known in the art, neutralizing solutions are employed to reduce hexavalent chromium ions to trivalent chromium ions. However with elastomer modified PPA, to obtain proper adhesion characteristics, removal of the chromium ions from the substrate is critical as compared to other plated plastics. Various compositions are known for neutralizing solutions, which generally require an acid, such as hydrochloric acid or sulfuric acid, and a reducing agent, such as stannous chloride. A suitable neutralizing treatment entails subjecting the article to a solution containing about 2 to about 8 volume percent hydrochloric acid, at a temperature of about 100° F. to about 140° F. (about 38° C. to about 60° C.) for a duration of about 0.5 to about 4 minutes. Hydrochloric acid is preferred because it is believed to provide a better exchange agent. Sulfuric acid could be used in the bath; however the result could be reduced adhesion of a subsequently deposited metal plating on the elastomer-modified PPA substrate.

Following neutralization, the substrate is rinsed with water to remove excess neutralizing solution, and then catalyzed with a catalyzing solution. A suitable solution for purposes of this invention is a tin-palladium catalyst in hydrochloric acid, in accordance with known solutions for catalyzing plastic articles. Importantly, formation of plating blisters has been unexpectedly avoided with catalyzing solutions containing about 8 to about 9 grams/liter of tin, which is higher than tin levels conventionally specified in catalyzing solutions. This may be due to improved protection of the catalyst itself as the article is transferred from the catalyst bath to the accelerator bath and finally to the electroless bath. Alternatively, it could be related to the further removal of chromium species from the substrate.

The substrate is then again rinsed to remove excess catalyzing solution, and then treated with an accelerator in order to remove excess tin of the tin-palladium complex from around the catalytic metal particles at the surface of the substrate, thereby promoting initiation of plating and reducing plating time by enhancing the catalytic effect of the palladium. While accelerator solutions containing sulfuric or hydrochloric acid are widely used for this purpose, it is foreseen that a mixture of hydrochloric and sulfuric acid will be used for this purpose, though it is also foreseeable that other acids or mixtures may be used.

The substrate is then rinsed and readied for plating. As an example, the substrate may be electrolessly plated with a suitable metal such as copper or nickel, and then subsequently electrochemically plated to produce a metal (e.g., chromium) finish on the article. Preferably, plating is carried out using standard plating cycles and baths for ABS materials. Importantly, if strong sulfuric acid is used in the electroplating bath, such as when depositing a first layer of copper with a plating bath containing copper sulfate and sulfuric acid, the thickness of the electroless metal deposit must be at least 0.000020 inch (about 0.5 micrometer), preferably with a fine grain microstructure, in order to adequately block sulfuric acid from attacking the PPA matrix through the electroless metal. Notably, conventional plating techniques for ABS materials are not limited by this thickness requirement for the electroless metal layer, since ABS materials are not susceptible to attack in the way elastomer-modified PPA materials have been determined to be.

Chrome-plated elastomer-modified PPA in accordance with this invention has been shown to exhibit excellent adhesion of the metal plate, and superior to that of identical specimens that were processed with one or more of the specified process parameters outside the ranges noted above. As shown in Tables I and II, metal plate-to-substrate adhesion was evaluated using a peel test carried out in accordance with ASTM test method B-533. For the data of Table I, substrates were etched in baths containing varying amounts of trivalent chromium ions, then subsequently rinsed, neutralized, catalyzed, electrolessly plated and electroplated with copper in accordance with the remaining parameters of the invention. For the data of Table II, substrates were etched in solutions containing about 6.0–6.3 oz./gal. (about 45–47 grams/liter) trivalent chromium, then rinsed in solutions at varying temperatures, but otherwise processed according to the invention.

The data of Tables I and II evidence the significant and surprising effect that trivalent chromium and rinse temperature have on peel strength, and therefore whether the plated elastomer-modified PPA article is acceptable for service where impact and thermal cycle resistance is necessary.

TABLE 1

| Trivalent Chromium Level (ounces/gallon) | Peel Strength (lbs.) |
| --- | --- |
| 3.6 | 0 |
| 4.3 | 0 |
| 6.0 | 2.2–4.4 |
| 7.0 | 8.0–12.0 |

| Etch Rinse Temperature (F.) | Peel Strength (lbs.) |
| --- | --- |
| 130 | 1.3 |
| 102 | 4.7 |
| 92 (avg.) | 6.9 (avg.) |

The performance of the elastomer-modified PPA substrates plated in accordance with this invention has also been shown to exhibit levels of metal plate adhesion superior to other plastic substrate materials that have been successfully plated commercially, such as PC, ABS, and PC modified with ABS. Elastomer-modified PPA articles processed in accordance with this invention are characterized by high-impact resistance that, when processed according to this invention, exhibits a higher temperature capability than prior art plated plastics. Notably, while metal plated ABS and ABS-modified PC substrates are prone to deformation, cracking and/or blistering at 250° F. (about 120° C.), elastomer-modified PPA materials of this invention are capable of withstanding temperatures of 350° F. (about 175° C.) without such defects occurring.

From the above, it can be seen that a significant aspect of the method of this invention is the attainment of high metal plate adhesion levels for an elastomer-modified PPA material, yielding a high impact, high temperature plastic material suitable for a wide variety of decorative applications. As shown above, elastomer-modified PPA processed in accordance with this invention exhibits exceptional adhesion, characterized by a peel strength of 8 pounds (about 36 Newtons) and higher, and is therefore highly resistant to impacts. Previous to the process of this invention, attempts to plate elastomer-modified PPA resins to obtain the above stated characteristics and thermal cycle requirements hereinabove set forth were commercially unsuccessful.

While our invention has been described in terms of a preferred embodiment, it is apparent that variations or modifications could be adopted by one skilled in the art without departing from the spirit of this invention. Accordingly, the scope of our invention is to be limited only by the following claims.

What is claimed is:

1. A process for metal plating an article of an elastomeric material dispersed in a polyphthalamide (PPA) matrix, said process comprising the steps of:

etching a surface of said article with an etching solution comprising trivalent chromium ions, hexavalent chromium ions and chromic acid-sulfuric acid, said trivalent chromium ions being present in said etching solution in at least a minimum amount of about 6.5 to 7.5 ounces per gallon of said etching solution, said etching solution being at a temperature of approximately 140° F. to 165° F. and contacting said surface for a duration sufficient to etch said PPA matrix and said elastomeric material so as to produce micropores in said surface;

rinsing said surface with a rinse solution maintained at a temperature of below about 100° F.;

neutralizing said surface to reduce hexavalent chromium ions from said etching step to trivalent chromium ions;

catalyzing said surface with a noble metal salt solution;

treating said surface with an accelerant solution; and then electrolessly depositing a metal layer on said surface.

2. A process as recited in claim 1, wherein said etching solution contains about 3.5 to about 4.5 lbs./gal. of chromic acid and about 10 to about 30 volume percent of said sulfuric acid.

3. A process as recited in claim 1, wherein said article comprises about five (5) to about thirty (30) weight percent of said elastomeric material.

4. A process as recited in claim 1, wherein said accelerant solution comprises a mixture of hydrochloric and sulfuric acids.

5. A process as recited in claim 1, further comprising the step of electroplating metal onto said metal layer so as to form a metal layer on said article.

6. A process as recited in claim 5, wherein said metal layer is characterized by a peel strength of at least eight (8) pounds as determined according to ASTM-method B-533.

7. A process for metal plating an article of an elastomer-modified polyphthalamide (PPA) material, said process comprising the steps of:

etching a surface of said article with an etching solution comprising trivalent chromium ions, hexavalent chromium ions and chromic-sulfuric acid, said trivalent chromium ions being present in said etching solution in an amount of about 6.5 to about 7.5 ounces per gallon of said etching solution, said etching solution being at a temperature of about 140° F. to 165° F. and contacting said surface for a duration sufficient to etch said elastomer modified PPA material at said surface so as to produce micropores in said surface;

rinsing said surface with a water solution maintained at a temperature below about and 130° F. with concentration control;

treating said surface with a neutralizing solution to reduce hexavalent chromium ions from said etching step to trivalent chromium ions;

catalyzing said surface with a noble metal salt solution;

treating said surface with an accelerant solution comprising an acid and a reducing agent;

electrolessly depositing a metal layer on said surface; and then electroplating metal onto said metal layer so as to form a metal layer on said article.

8. A process as recited in claim 7, wherein said etching solution contains about 3.5 to about 4.5 lbs./gal. of chromic acid and about 10 to about 30 volume percent of said sulfuric acid.

9. A process as recited in claim 7, wherein said article comprises about five (5) to about thirty (30) weight percent of said elastomer material.

10. A process as recited in claim 7, wherein said article comprises about twenty-five weight percent of said elastomer material.

11. A process as recited in claim 7, wherein said accelerant solution comprises a mixture of hydrochloric and sulfuric acid.

12. A process as recited in claim 7, wherein said metal layer is characterized by a peel strength of at least eight (8) pounds.

13. A process as recited in claim 7, wherein said duration of said etching step is about three to about fifteen minutes.

14. A process as recited in claim 7, wherein said rinsing step is for a duration of approximately three minutes to less than fifteen minutes.

15. A process as recited in claim 7, wherein said neutralizing solution comprises a stannous chloride as said reducing agent and about two to about eight volume percent hydrochloric acid as said acid.

16. A process for electroplating an elastomer-modified polyphthalamide PPA material plastic article, said process comprising the steps of:

etching a surface of said article with a chromic acid-sulfuric acid etching solution comprising about 3.5 to about 4.5 lbs./gal chromic acid and about 10 to about 30 volume percent sulfuric acid, and containing about 6.5 to about 7.5 oz./gal. trivalent chromium ions, said etching solution being at a temperature of about 140° F. to about 165° F. and contacting said surface for a duration of about three to about fifteen minutes to etch said elastomeric modified PPA material at said surface so as to produce micropores in said surface;

rinsing said surface for a duration of less than ten minutes using a water solution maintained at a temperature between about 100° F. to control the extent of accumulation of chromium content of said solution;

treating said surface with a neutralizing solution at a temperature of about 100° F. to about 140° F. for a duration of about 0.5 to about 4 minutes so as to reduce hexavalent chromium ions from said etching step to trivalent chromium ions, said neutralizing solution comprising a reducing agent and about two to about eight volume percent hydrochloric acid;

rinsing said surface to remove excess neutralizing solution;

treating said surface with a catalyzing solution comprising hydrochloric acid, tin and palladium;

rinsing to remove excess catalyzing solution from said surface;

treating said surface with an accelerant solution to remove excess tin from said surface;

electrolessly depositing a metal layer having a thickness of at least about 0.000020 inch on said surface, said metal layer being a metal selected from the group consisting of copper and nickel; and then electroplating metal onto said electroless metal layer with a solution containing sulfuric acid.

17. A method for electroplating a high impact resistance plastic article comprising the steps of:

providing a substrate of polyphthalamide (PPA) matrix which has been modified with about five (5) to thirty (30) weight percent of an elastomer material;

etching a surface of said article with an etching solution comprising trivalent chromium ions, hexavalent chromium ions and chromic/sulfuric acid, said trivalent chromium ions being present in said etching solution in at least a minimum amount of about 6.5 to 7.5 ounces per gallon of said etching solution, said etching solution being at a temperature of about 140° F. to 165° F. and contacting said surface for a duration sufficient to etch said PPA matrix and said elastomeric material so as to produce micropores in said surface;

rinsing said surface with a rinse solution maintained at a temperature below about 100° F.;

neutralizing said surface to reduce hexavalant chromium ions from said etching step to trivalent chromium ions;

catalyzing said surface with an accelerant solution; and then electrolessly depositing a metal layer on said surface.

18. A process as recited in claim 17, wherein said etching solution contains about 3.5 to about 4.5 lbs./gal. of chromic acid and about 10 to about 30 volume percent of said sulfuric acid.

19. A process as recited in claim 17, wherein said article comprises about five (5) to about thirty (30) weight percent of said elastomeric material.

20. A process as recited in claim 17, wherein said accelerant solution comprises a mixture of hydrochloric and sulfuric acids.

21. A process as recited in claim 18, further comprising the step of electroplating metal onto said metal layer so as to form a metal layer on said article.

22. A process as recited in claim 17, wherein said metal layer is characterized by a peel strength of at least eight (8) pounds as determined according to ASTM-method B-533.

23. A process for metal plating an article of an elastomeric material dispersed in a polyphthalamide (PPA) matrix, said process comprising the steps of:

etching a substrate surface of said article with an etching solution comprising trivalent chromium ions, hexavalent chromium ions and chromic acid-sulfuric acid, said trivalent chromium ions being present in said etching solution in at least a minimum amount of about 6.5 to about 7.5 ounces per gallon of said etching solution, said etching solution being at a temperature of about 140° F. to 165° F. and contacting with said substrate surface for a duration sufficient to etch said PPA matrix and said elastomeric material so as to produce micropores in said surface;

rinsing said surface with a rinse solution maintained at a temperature below about 130° F. with concentration control:

so as to control the absorption of said chromium trivalent/hexavalent ions by said rinse solution;

neutralizing said surface with a neutralizing solution to reduce hexavalent chromium ions from said etching step to trivalent chromium ions;

catalyzing said surface with a noble metal salt solution;

treating said surface with an accelerant solution; and then electrolessly depositing a metal layer on said surface.

24. A process as recited in claim 23, wherein said etching solution contains about 3.5 to about 4.5 lbs/gal. of chromic acid and about 10 to about 30 volume percent of said sulfuric acid.

25. A process as recited in claim 23, wherein said article comprises about five (5) to about thirty (30) weight percent of said elastomeric material.

26. A process as recited in claim 23, wherein said accelerant solution comprises a mixture of hydrochloric and sulfuric acids.

27. A process as recited in claim 23, further comprising the step of electroplating metal onto said metal layer so as to form a metal layer on said article.

28. A process as recited in claim 27, wherein said metal layer is characterized by a peel strength of at least eight (8) pounds as determined according to ASTM-method B-533.

29. A process as recited in claim 23, wherein said duration of said etching step is about three to about fifteen minutes.

30. A process as recited in claim 23, wherein said rinsing step is for a duration of approximately three minutes to less than fifteen minutes.

31. A process as recited in claim 23, wherein said neutralizing solution comprises a stannous chloride as said reducing agent and about two to about eight volume percent hydrochloric acid as said acid.

* * * * *

UNITED STATES PATENT AND TRADEMARK OFFICE
CERTIFICATE OF CORRECTION

PATENT NO. : 5,928,727
DATED : July 27, 1999
INVENTOR(S) : Roger J. Timmer

It is certified that error appears in the above-identified patent and that said Letters Patent is hereby corrected as shown below:

```
Colulmn 3, line 45, delete "100F.," and insert -- 100 F,--
Column 9, line 66, delete "and".
Column 10, line 51, delete "between" and insert -- below--.
Column 12, line 15, delete "s aid" and insert --said--.
Column 12, line 24, delete "lbs/gal." and insert -- lbs./gal.--.
```

Signed and Sealed this

Twenty-sixth Day of December, 2000

Attest:

Q. TODD DICKINSON

Attesting Officer

Director of Patents and Trademarks